United States Patent
Yoshida

(10) Patent No.: US 7,635,918 B2
(45) Date of Patent: Dec. 22, 2009

(54) HIGH FREQUENCY DEVICE MODULE AND MANUFACTURING METHOD THEREOF

(75) Inventor: Tomohiro Yoshida, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/112,656

(22) Filed: Apr. 30, 2008

(65) Prior Publication Data

US 2008/0203561 A1     Aug. 28, 2008

Related U.S. Application Data

(63) Continuation of application No. PCT/JP2007/000509, filed on May 11, 2007.

(30) Foreign Application Priority Data

May 16, 2006   (JP) ............................... 2006-136290

(51) Int. Cl.
*H01L 23/34* (2006.01)
(52) U.S. Cl. ................. 257/728; 257/678; 257/700; 257/709; 257/713; 257/787; 257/E23.128; 257/E23.167; 257/E23.169
(58) Field of Classification Search ................ 257/728, 257/678–733
See application file for complete search history.

(56) References Cited

U.S. PATENT DOCUMENTS 4,864,384 A  *  9/1989   Boudot et al. ............... 257/728
6,621,162 B1 *  9/2003   Ishida et al. ................ 257/728

FOREIGN PATENT DOCUMENTS

| JP | 04-248871 A | 9/1992 |
| JP | 2001-035956 A | 2/2001 |
| JP | 2001-345419 A | 12/2001 |
| JP | 2003-179181 A | 6/2003 |
| JP | 2003-298004 A | 10/2003 |
| JP | 2005-109306 A | 4/2005 |

* cited by examiner

*Primary Examiner*—Jasmine J Clark
(74) *Attorney, Agent, or Firm*—Oblon, Spivak, McClelland, Maier & Neustadt, L.L.P.

(57) ABSTRACT

A high frequency device module of an embodiment of a current invention includes: an insulation substrate in which electrodes are provided on the front surface thereof and a grounding substrate is provided on the rear surface thereof; a high frequency device provided on the insulation substrate with a terminal of the device connected to the electrodes; potting material for covering the high frequency device; and a metallic layer provided on the potting material and connected to the grounding substrate.

15 Claims, 3 Drawing Sheets

HIGH FREQUENCY DEVICE MODULE AND MANUFACTURING METHOD THEREOF

CROSS-REFERENCE TO RELATED APPLICATION

This application is based upon and claims the benefit of priority from International Application No. PCT/JP2007/000509, filed on May 11, 2007, which is based upon and claims the benefit of priority from the prior Japanese Patent Application No. 2006-136290, filed on May 16, 2007, the entire contents of which are incorporated herein by reference.

BACKGROUND OF THE INVENTION (1) Field of the Invention

The present invention relates to a high frequency device module in which a high frequency device such as a micro wave device is buried and more particularly to a structure of the same.

(2) Description of the Invention

Demands for increase of transmission capacity have been intensified more and more with a progress of information society in recent years, so that a system having a larger transmission capacity and a higher level modulation system have been demanded. Accompanied by this, devices having a high gain and produced at an inexpensive cost have been requested.

To meet such demands, a module disclosed in, for example, Japanese Patent Application Laid-Open No. 2001-345419 is known. In the module, a simple package in which a single sheet of ceramic has a metal plate and a device is fixed thereon is coated with polyimide so as to protect the surface and potting material for protecting wire and the device is applied thereon.

However, although the potting material has insulation property, if a high performance device or a high gain device is used, electromagnetic field is radiated thereby affecting the environment or its performance is deteriorated extremely by incoming of surrounding electromagnetic field or output of microwave emitted from itself. For the reason, application field of this high frequency device module is sometimes confined.

Further, Japanese Patent Application Laid-Open No. 2003-298004 has disclosed a high frequency device module sealed with insulating resin by dispersing metallic particles such as Ni particles in order to prevent an interference of electromagnetic wave between active device chips which operate in a high frequency band.

However, in a case where such a high frequency device module is used, there is a possibility that its metallic particles may corrode and a problem that sufficient electromagnetic shielding cannot be achieved in a long period.

BRIEF SUMMARY OF THE INVENTION

An object of the present invention is to provide a high frequency device module in which influences of electromagnetic wave to outside and from outside are small, thereby ensuring excellent electric performance and having a simple structure, manufactured at an inexpensive cost and manufacturing method thereof.

According to an aspect of the present invention, there is provided a high frequency device module including: an insulation substrate; a high frequency device provided on the insulation substrate; potting material for covering the high frequency device; and metallic layer provided on the potting material with at least an end thereof grounded.

According to another aspect of the present invention, there is provided a high frequency device module including: an insulation substrate in which electrodes are provided on the front surface thereof and a grounding substrate is provided on the rear surface thereof; a high frequency device provided on the insulation substrate with a terminal thereof connected to the electrodes; potting material for covering the high frequency device; and metallic layer provided on the potting material and connected to the grounding substrate.

Consequently, it is possible to obtain a high frequency device module in which influences of electromagnetic wave to outside and from outside is small in a long period, thereby ensuring excellent electric performance and having a simple structure, manufactured at an inexpensive cost.

DETAILED DESCRIPTION OF THE INVENTION

Hereinafter embodiments of the present invention will be described with reference to the accompanying drawings.

First Embodiment

Figure 1:
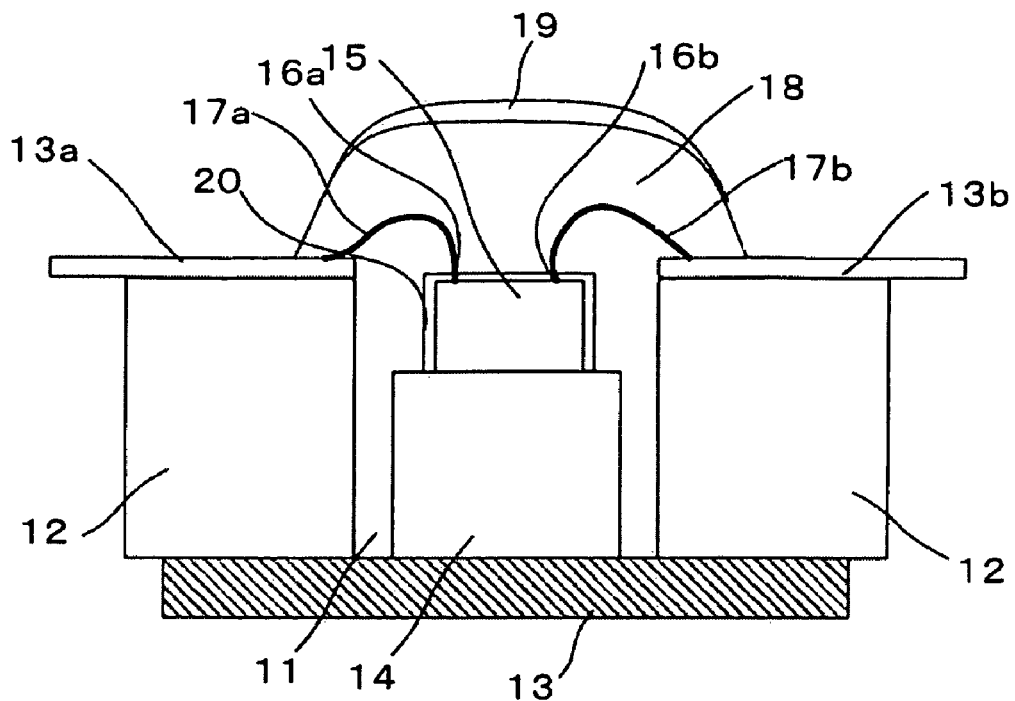
FIG. 1 is a sectional view showing the structure of a first embodiment of the present invention.
Figure 2:
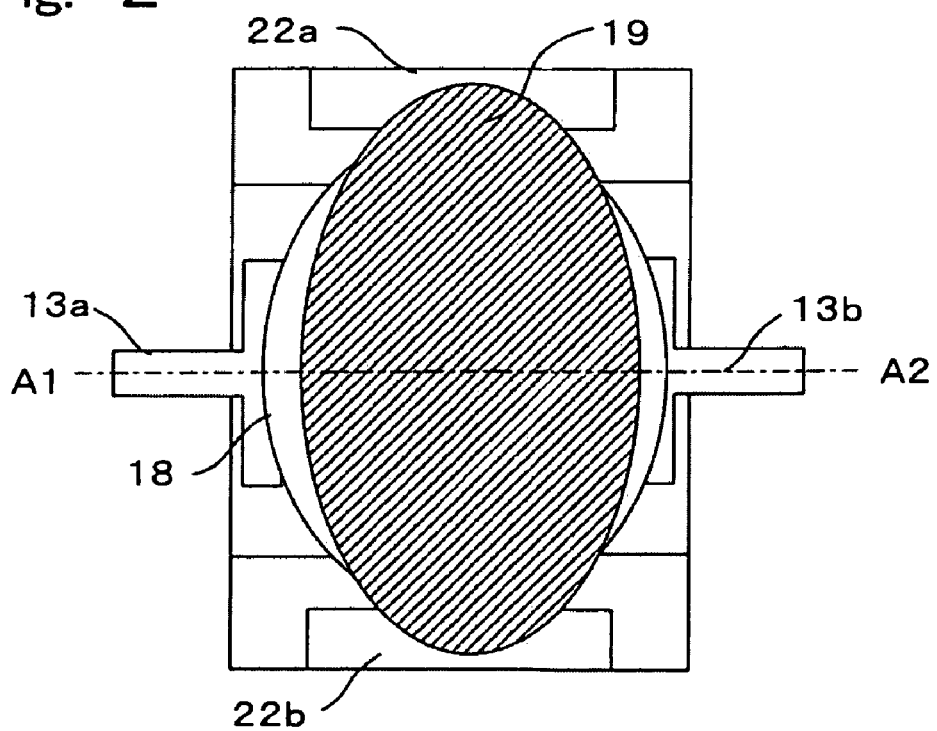
FIG. 2 is a top view of the first embodiment of the present invention.

FIG. 1 is a sectional view showing the structure of a high frequency device module according to a first embodiment of the present invention. FIG. 2 is a top view of this high frequency device module. FIG. 1 shows a sectional view taken along A1-A2 of FIG. 2.

The high frequency module of the present invention includes an insulation substrate 12 having a specified hole portion 11, composed of ceramic and equipped with wiring on its surface; electrodes 13a, 13b placed on the surface of the insulation substrate 12; a grounding substrate 13 provided including the rear face of the hole portion 11; a base portion 14 provided within the hole portion 11 on the grounding substrate 13; a high frequency device 15 fixed on the base portion 14; wires 17a, 17b composed of for example, gold, for connecting device terminals 16a, 16b of the high frequency device 15 to the electrodes 13a, 13b on the insulation substrate 12; potting material 18 covered on the wires 17a, 17b and the high frequency device 15 to seal them, and metallic film 19 provided on the potting material 18. The high frequency device 15 is, for example, a field effect transistor (FET) and the peripheral surface thereof is coated with, surface protecting material, for example, polyimide 20 in order to protect the surface of the device and improve adhesion of the surface.

Figure 3:
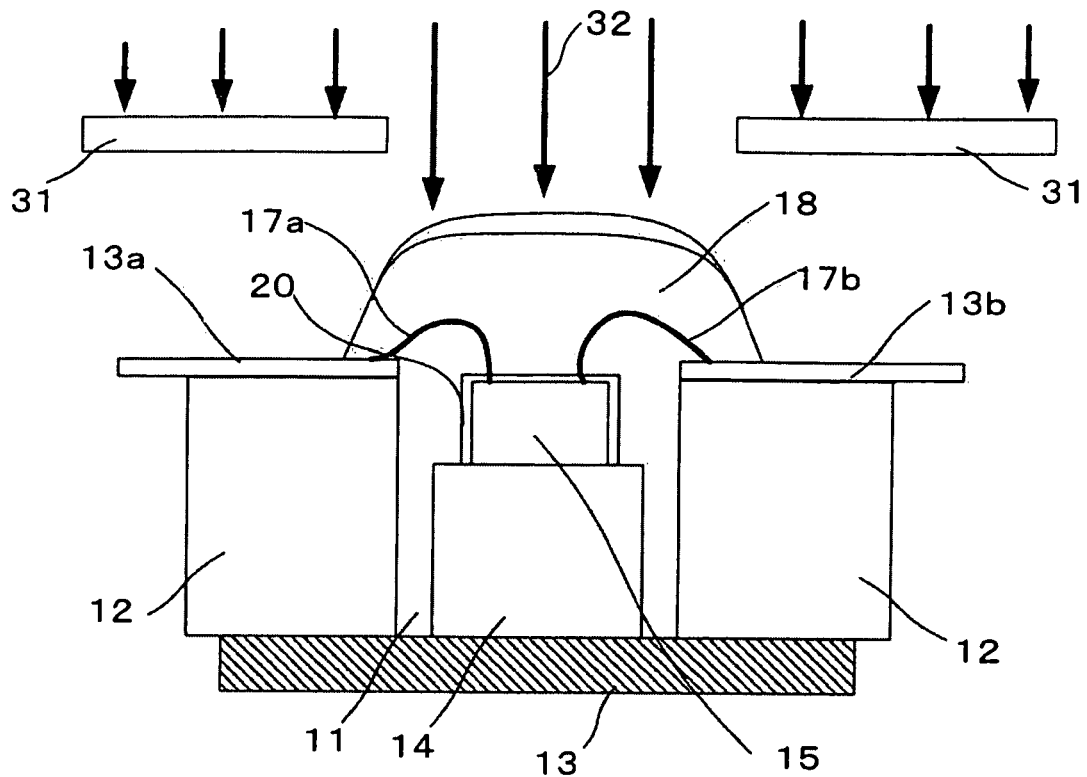
FIG. 3 is a view for explaining a manufacturing method of the first embodiment of the present invention.

Next, a manufacturing method of the high frequency device module of this embodiment will be described. The same method as conventionally is used until the potting material 18 is provided. Then, as shown in FIG. 3, a mask pattern 31 in which only a required portion above the potting material 18 is bored is provided and by depositing metal material, for example, aluminum through this mask pattern, metallic film 19 is provided. Preferably, the thickness of the metallic film 19 is 1-5 μm.

The metallic film 19 is formed in a size and a shape as shown in FIG. 2. That is, as shown in FIG. 2, grounding terminals 22a, 22b are provided on the insulation substrate 12 in a direction orthogonal to the section shown in FIG. 1 and the metallic film 19 on the potting material 18 is configured to be connected to the grounding terminals 22a, 22b. The grounding terminals 22a, 22b are connected to the grounding substrate 13.

On the other hand, the hole portion 11 in the insulation substrate 12 is covered with the potting material 18 as well as the electrodes 13a, 13b. The metallic film 19 is provided not to be in contact with the electrodes 13a, 13b. By forming the metallic film 19 in such a size and shape, the metallic film 19 is connected to the grounding terminals 22a, 22b so as to achieve electromagnetic shielding.

By using aluminum as the metallic film 19, high shielding effect can be achieved so that an inexpensive high frequency device can be obtained.

According to this embodiment, the high frequency device 15 can be completely electromagnetically sealed thereby reducing influences from outside. Further, isolation is improved, so that a high gain high frequency device can be handled and an inexpensive high frequency device module is obtained.

Second Embodiment

In a monolithic microwave integrated circuit (MMIC) device for use as the aforementioned high frequency device, the terminal position of the module is frequently changed due to demands for reduction in size. In such a case, although it can be considered to change the bonding wire, if wire is constructed to stride over the high frequency device in a high gain device such as the MMIC device, such a fault that oscillation is induced by electromagnetic field generated in the device may be generated. A second embodiment described next concerns a high frequency device module suiting such a case.

Figure 4:
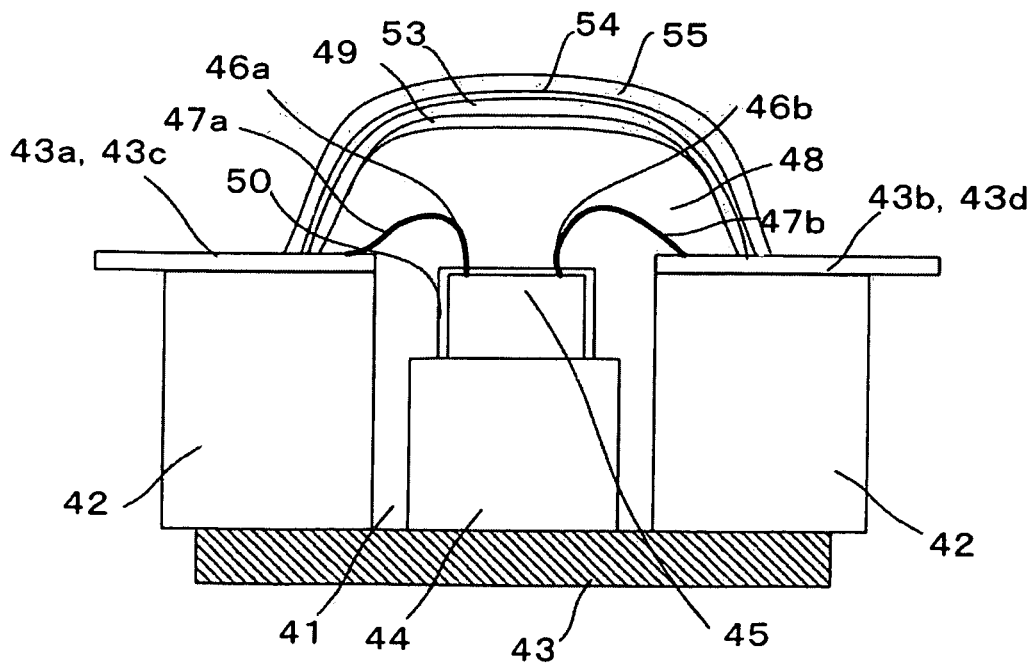
FIG. 4 is a sectional view showing the structure of a second embodiment of the present invention.

FIG. 4 is a sectional view showing the structure of a high frequency device module according to the second embodiment. Reference numerals 41-52b correspond to the reference numerals 11-22b shown in FIG. 1.

For example, a base portion 41 is provided in a hole portion 41 of an insulation substrate 42 composed of ceramic and a high frequency device 45 which is, for example, a MMIC device, is mounted on the base portion 41 while a grounding substrate 43 is provided on the rear face of the insulation substrate 42. Electrodes 43a, 43c and electrodes 43b, 43d are provided on the surface of the insulation substrate 42 and wires 47a, 47b composed of gold are connected to these electrodes. The peripheral surface of the high frequency device 45 is coated with for example, polyimide 50 as the surface protecting material of this device. The high frequency device 45 and wire are sealed with potting material 48. Metallic film 49, for example, aluminum is provided on the potting material 48 in a thickness of 1-5 μm by deposition like the first embodiment.

Figure 5:
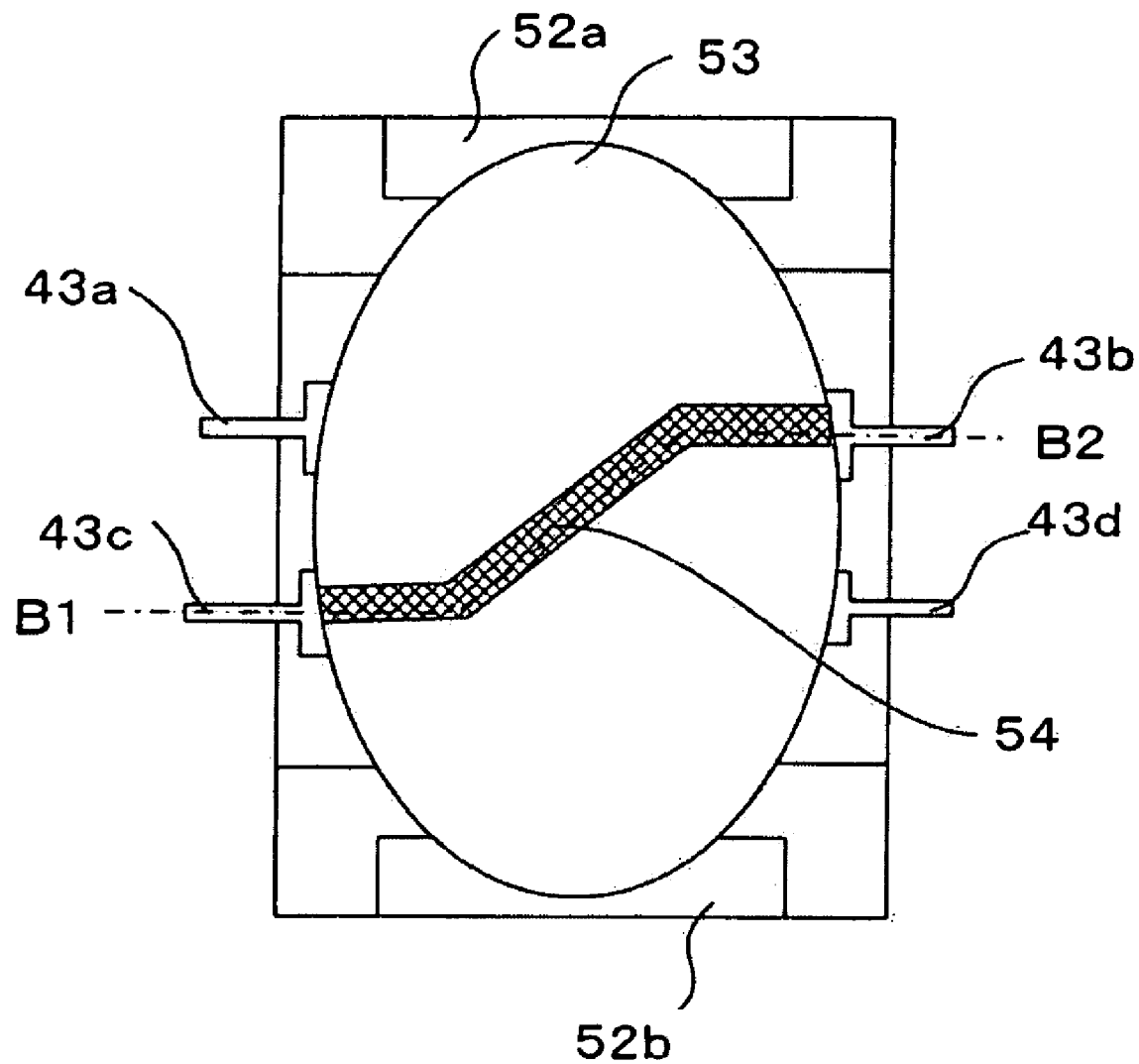
FIG. 5 is a view for explaining wiring pattern in the second embodiment of the present invention.

In this embodiment, the metallic film 49 is coated with organic polyimide 53 as an insulation layer and as shown in FIG. 5, wiring pattern 54 for connecting the electrode 43b and the electrode 43c is provided thereon. FIG. 4 is a sectional view taken along a chain line B1-B2.

As shown in FIG. 4, the wiring pattern 54 is coated with organic polyimide 55 as protective layer for protecting the wiring pattern 54.

This embodiment of the present invention has an advantage of obtaining an inexpensive and stable high frequency device module which never oscillates even when the electrodes serving as a device terminal are connected with each other.

Although the embodiment has been described about a case of using the FET and MMIC device as the high frequency device, the present invention is not limited to this example but may be applied to a module having a device used for high frequency wave such as micro wave.

The embodiment has been described about a high frequency device module having a structure in which the high frequency device is provided in the hole portion formed on an insulation substrate and sealed with the potting material. However, the present invention is not limited to such a module but may be applied to a high frequency device module having a structure in which the high frequency device is provided on the insulation substrate and covered with the potting material.

The embodiment has been described about a case where the peripheral surface of the high frequency device is coated with polyimide as surface protecting material. By coating the high frequency device with polyimide, the high frequency device can be protected, and adhesion between the high frequency device and the potting material can be intensified. However, as long as adhesion between the high frequency device and the potting material is excellent, the surface protecting material of the present invention is not limited to polyimide but other material may be applied. Further, if it is not necessary to protect the high frequency device, the present invention does not always require any surface protecting material.

Although the embodiment has been described about a case where the metallic film is provided on the potting material, the present invention is not limited to the metallic film but generally, its requirement is satisfied by providing with metallic layer.

In the embodiment, a case where the grounding substrate is provided on the rear face of the insulation substrate and a grounding terminal connected to this grounding substrate is provided on the surface of the insulation substrate has been described. However, the present invention is not limited to such a module but the metallic layer formed on the potting material only needs to be grounded through at least an end thereof. Generally, the high frequency device module of the present invention needs to include the insulation substrate, the high frequency device provided on the insulation substrate, the potting material for covering the high frequency device and the metallic layer provided on the potting material with at least one end thereof grounded.

Although in the embodiment, a case where a single high frequency device is provided on the insulation substrate has been described, a plurality of the high frequency devices may be provided.

The present invention is not limited to the embodiments but may be modified in various ways within a scope of the technical idea of the invention.

What is claimed is:

1. A high frequency device module comprising:
    an insulation substrate in which electrodes are provided on the front surface thereof and a grounding substrate is provided on the rear surface thereof;
    a high frequency device provided in an opening of the insulation substrate with a terminal thereof connected to the electrodes;

potting material for covering the high frequency device; and a metallic layer provided on the potting material and connected to the grounding substrate.

2. The high frequency device module according to claim 1, wherein the metallic layer is an aluminum thin film.

3. A high frequency device module comprising:

an insulation substrate having a hole portion and provided with electrodes on the surface thereof;

a grounding substrate which covers at least the hole portion on the rear face of the insulation substrate;

a high frequency device provided in the hole portion in an opening of the insulation substrate with a terminal thereof connected to the electrodes;

potting material for covering the high frequency device; and a metallic layer provided on the potting material and connected to the grounding substrate.

4. The high frequency device module according to claim 3, wherein the metallic layer is an aluminum thin film.

5. A high frequency device module comprising:

an insulation substrate in which electrodes are provided on the front surface thereof and a grounding substrate is provided on the rear surface thereof;

a high frequency device provided on the insulation substrate with a terminal thereof connected to the electrodes;

surface protecting material applied to protect the surface of the high frequency device;

potting material for sealing the high frequency device coated with the surface protecting material;

a metallic layer provided on the potting material and connected to the grounding substrate;

an insulation layer provided to cover the metallic layer;

a wiring pattern provided on the insulation layer and connected to the electrodes; and a protective layer provided on the wiring pattern.

6. The high frequency device module according to claim 5, wherein the surface protecting material is polyimide.

7. The high frequency device module according to claim 6, wherein the metallic layer is an aluminum thin film.

8. The high frequency device module according to claim 7, wherein the high frequency device is a monolithic microwave integrated circuit device.

9. A high frequency device module comprising:

an insulation substrate having a hole portion and provided with electrodes on the surface thereof;

a grounding substrate which covers at least the hole portion on the rear face of the insulation substrate;

a high frequency device provided in the hole portion with a terminal thereof connected to the electrodes;

surface protecting material applied to protect the surface of the high frequency device;

potting material for sealing the high frequency device coated with the surface protecting material;

a metallic layer provided on the potting material and connected to the grounding substrate;

an insulation layer provided to cover the metallic layer;

a wiring pattern provided on the insulation layer and connected to the electrodes; and a protective layer provided on the wiring pattern.

10. The high frequency device module according to claim 9, wherein the surface protecting material is polyimide.

11. The high frequency device module according to claim 10, wherein the metallic layer is an aluminum thin film.

12. The high frequency device module according to claim 11, wherein the high frequency device is a monolithic microwave integrated circuit device.

13. A manufacturing method of a high frequency device module, comprising:

providing a high frequency device a terminal of which is connected to electrodes on an insulation substrate in which the electrodes are provided on the front surface thereof and a grounding substrate is provided on the rear surface thereof;

covering the high frequency device with potting material;

providing a metallic layer on the potting material; and connecting the metallic layer to the grounding substrate.

14. A manufacturing method of a high frequency device module, comprising:

providing a high frequency device a terminal of which is connected to electrodes on an insulation substrate in which the electrodes are provided on the front surface thereof and a grounding substrate is provided on the rear surface thereof;

applying surface protecting material to the high frequency device to protect the surface thereof;

sealing the high frequency device coated with the surface protecting material by using potting material;

providing a metallic layer connected to the grounding substrate on the potting material;

providing with an insulation layer to cover the metallic layer;

providing a wiring pattern connected to the electrodes on the insulation layer; and providing a protective layer on the wiring pattern.

15. The manufacturing method of a high frequency device module according to claim 14, wherein the surface protecting material is polyimide.

* * * * *